US008882310B2

(12) United States Patent
Mandelboum et al.

(10) Patent No.: US 8,882,310 B2
(45) Date of Patent: Nov. 11, 2014

(54) LASER DIE LIGHT SOURCE MODULE WITH LOW INDUCTANCE

(71) Applicant: Microsoft Corporation, Redmond, WA (US)

(72) Inventors: David Mandelboum, Rakefet (IL); Giora Yahav, Haifa (IL); Asaf Pellman, Beit Yehoshua (IL); Shlomo Felzenshtein, Nesher (IL)

(73) Assignee: Microsoft Corporation, Redmond, WA (US)

( * ) Notice: Subject to any disclaimer, the term of this patent is extended or adjusted under 35 U.S.C. 154(b) by 0 days.

(21) Appl. No.: 13/709,121

(22) Filed: Dec. 10, 2012

(65) Prior Publication Data

US 2014/0160745 A1 Jun. 12, 2014

(51) Int. Cl.
*F21V 29/00* (2006.01)
*G01S 17/89* (2006.01)
*F21V 13/02* (2006.01)
*H05K 1/02* (2006.01)
*G02B 27/20* (2006.01)
*F21V 21/00* (2006.01)
*H01S 5/022* (2006.01)
*H01S 5/024* (2006.01)
*H01S 5/40* (2006.01)

(52) U.S. Cl.
CPC .............. *F21V 21/00* (2013.01); *G01S 17/89* (2013.01); *H01S 5/02296* (2013.01); *H01S 5/024* (2013.01); *F21V 13/02* (2013.01); *H01S 5/02276* (2013.01); *H05K 1/0296* (2013.01); *G02B 27/20* (2013.01); *H01S 5/4031* (2013.01); *H01S 5/02288* (2013.01); *H01L 5/06209* (2013.01); *H01S 5/02212* (2013.01); *H01S 5/02236* (2013.01); *H01S 5/022* (2013.01)
USPC ............................ 362/373; 362/294; 362/362

(58) Field of Classification Search
CPC ....... F21V 17/00; F21V 17/005; F21V 23/00; F21V 23/002; H01L 23/66; H01L 33/62; H01L 33/647

USPC ............ 257/E33.066, E33.075; 348/46, 135; 362/294, 373, 362, 382; 372/34, 36, 372/38.08

See application file for complete search history.

(56) References Cited

U.S. PATENT DOCUMENTS 4,199,703 A  4/1980 Samson
4,627,620 A  12/1986 Yang
(Continued)

FOREIGN PATENT DOCUMENTS

CN  101254344 B  6/2010
DE  4036896      2/1992
(Continued)

OTHER PUBLICATIONS

"Power Supply for SIRILAS-30W High Power Laser Diode SPL LG81"—Application Note; Opto Semiconductors: OSRAM Catalog: Jan. 21, 2005, pp. 1-5.

(Continued)

*Primary Examiner* — Nimeshkumar Patel
*Assistant Examiner* — Steven Horikoshi
(74) *Attorney, Agent, or Firm* — Gregg Wisdom; Judy Yee; Micky Minhas

(57) ABSTRACT

An embodiment of the invention provides a low inductance light source module, which may have a small footprint and comprise a printed circuit board (PCB) mount having first and second conducting traces formed on a side of the PCB mount and a semiconducting light source having a first electrical contacts for receiving power that is bonded to the first conducting trace with a conducting bonding material and a second electrical contact for receiving power that is connected by at least one bondwire to the second conducting trace.

20 Claims, 4 Drawing Sheets

(56) References Cited

U.S. PATENT DOCUMENTS

| | | | |
|---|---|---|---|
| 4,630,910 A | 12/1986 | Ross et al. | |
| 4,645,458 A | 2/1987 | Williams | |
| 4,695,953 A | 9/1987 | Blair et al. | |
| 4,702,475 A | 10/1987 | Elstein et al. | |
| 4,711,543 A | 12/1987 | Blair et al. | |
| 4,751,642 A | 6/1988 | Silva et al. | |
| 4,796,997 A | 1/1989 | Svetkoff et al. | |
| 4,809,065 A | 2/1989 | Harris et al. | |
| 4,817,950 A | 4/1989 | Goo | |
| 4,843,568 A | 6/1989 | Krueger et al. | |
| 4,893,183 A | 1/1990 | Nayar | |
| 4,901,362 A | 2/1990 | Terzian | |
| 4,925,189 A | 5/1990 | Braeunig | |
| 5,101,444 A | 3/1992 | Wilson et al. | |
| 5,148,154 A | 9/1992 | MacKay et al. | |
| 5,168,537 A | 12/1992 | Rajasekharan et al. | |
| 5,184,295 A | 2/1993 | Mann | |
| 5,229,754 A | 7/1993 | Aoki et al. | |
| 5,229,756 A | 7/1993 | Kosugi et al. | |
| 5,239,463 A | 8/1993 | Blair et al. | |
| 5,239,464 A | 8/1993 | Blair et al. | |
| 5,245,620 A * | 9/1993 | Tanaka et al. | 372/36 |
| 5,288,078 A | 2/1994 | Capper et al. | |
| 5,295,491 A | 3/1994 | Gevins | |
| 5,320,538 A | 6/1994 | Baum | |
| 5,347,306 A | 9/1994 | Nitta | |
| 5,385,519 A | 1/1995 | Hsu et al. | |
| 5,405,152 A | 4/1995 | Katanics et al. | |
| 5,417,210 A | 5/1995 | Funda et al. | |
| 5,423,554 A | 6/1995 | Davis | |
| 5,454,043 A | 9/1995 | Freeman | |
| 5,469,740 A | 11/1995 | French et al. | |
| 5,495,576 A | 2/1996 | Ritchey | |
| 5,516,105 A | 5/1996 | Eisenbrey et al. | |
| 5,524,637 A | 6/1996 | Erickson | |
| 5,534,917 A | 7/1996 | MacDougall | |
| 5,563,988 A | 10/1996 | Maes et al. | |
| 5,569,957 A | 10/1996 | McLean | |
| 5,577,981 A | 11/1996 | Jarvik | |
| 5,580,249 A | 12/1996 | Jacobsen et al. | |
| 5,594,469 A | 1/1997 | Freeman et al. | |
| 5,597,309 A | 1/1997 | Riess | |
| 5,616,078 A | 4/1997 | Oh | |
| 5,617,312 A | 4/1997 | Iura et al. | |
| 5,638,300 A | 6/1997 | Johnson | |
| 5,641,288 A | 6/1997 | Zaenglein | |
| 5,682,196 A | 10/1997 | Freeman | |
| 5,682,229 A | 10/1997 | Wangler | |
| 5,690,582 A | 11/1997 | Ulrich et al. | |
| 5,703,367 A | 12/1997 | Hashimoto et al. | |
| 5,704,837 A | 1/1998 | Iwasaki et al. | |
| 5,715,834 A | 2/1998 | Bergamasco et al. | |
| 5,875,108 A | 2/1999 | Hoffberg et al. | |
| 5,877,803 A | 3/1999 | Wee et al. | |
| 5,913,727 A | 6/1999 | Ahdoot | |
| 5,933,125 A | 8/1999 | Fernie | |
| 5,980,256 A | 11/1999 | Carmein | |
| 5,989,157 A | 11/1999 | Walton | |
| 5,995,649 A | 11/1999 | Marugame | |
| 6,005,548 A | 12/1999 | Latypov et al. | |
| 6,009,210 A | 12/1999 | Kang | |
| 6,054,991 A | 4/2000 | Crane et al. | |
| 6,066,075 A | 5/2000 | Poulton | |
| 6,072,494 A | 6/2000 | Nguyen | |
| 6,073,489 A | 6/2000 | French et al. | |
| 6,077,201 A | 6/2000 | Cheng et al. | |
| 6,098,458 A | 8/2000 | French et al. | |
| 6,100,896 A | 8/2000 | Strohecker et al. | |
| 6,101,289 A | 8/2000 | Kellner | |
| 6,128,003 A | 10/2000 | Smith et al. | |
| 6,130,677 A | 10/2000 | Kunz | |
| 6,141,463 A | 10/2000 | Covell et al. | |
| 6,147,678 A | 11/2000 | Kumar et al. | |
| 6,152,856 A | 11/2000 | Studor et al. | |
| 6,159,100 A | 12/2000 | Smith | |
| 6,173,066 B1 | 1/2001 | Peurach et al. | |
| 6,181,343 B1 | 1/2001 | Lyons | |
| 6,188,777 B1 | 2/2001 | Darrell et al. | |
| 6,215,890 B1 | 4/2001 | Matsuo et al. | |
| 6,215,898 B1 | 4/2001 | Woodfill et al. | |
| 6,226,396 B1 | 5/2001 | Marugame | |
| 6,229,913 B1 | 5/2001 | Nayar et al. | |
| 6,256,033 B1 | 7/2001 | Nguyen | |
| 6,256,400 B1 | 7/2001 | Takata et al. | |
| 6,283,860 B1 | 9/2001 | Lyons et al. | |
| 6,289,112 B1 | 9/2001 | Jain et al. | |
| 6,299,308 B1 | 10/2001 | Voronka et al. | |
| 6,308,565 B1 | 10/2001 | French et al. | |
| 6,316,934 B1 | 11/2001 | Amorai-Moriya et al. | |
| 6,363,160 B1 | 3/2002 | Bradski et al. | |
| 6,384,819 B1 | 5/2002 | Hunter | |
| 6,411,744 B1 | 6/2002 | Edwards | |
| 6,430,997 B1 | 8/2002 | French et al. | |
| 6,476,834 B1 | 11/2002 | Doval et al. | |
| 6,496,598 B1 | 12/2002 | Harman | |
| 6,501,167 B2 | 12/2002 | Hanamura | |
| 6,503,195 B1 | 1/2003 | Keller et al. | |
| 6,539,931 B2 | 4/2003 | Trajkovic et al. | |
| 6,570,555 B1 | 5/2003 | Prevost et al. | |
| 6,633,294 B1 | 10/2003 | Rosenthal et al. | |
| 6,640,202 B1 | 10/2003 | Dietz et al. | |
| 6,661,918 B1 | 12/2003 | Gordon et al. | |
| 6,681,031 B2 | 1/2004 | Cohen et al. | |
| 6,714,665 B1 | 3/2004 | Hanna et al. | |
| 6,727,934 B1 | 4/2004 | Suda | |
| 6,731,799 B1 | 5/2004 | Sun et al. | |
| 6,738,066 B1 | 5/2004 | Nguyen | |
| 6,765,726 B2 | 7/2004 | French et al. | |
| 6,778,574 B1 * | 8/2004 | Shimonaka et al. | 372/43.01 |
| 6,788,809 B1 | 9/2004 | Grzeszczuk et al. | |
| 6,801,637 B2 | 10/2004 | Voronka et al. | |
| 6,821,128 B2 | 11/2004 | Belopolsky | |
| 6,873,723 B1 | 3/2005 | Aucsmith et al. | |
| 6,876,496 B2 | 4/2005 | French et al. | |
| 6,937,742 B2 | 8/2005 | Roberts et al. | |
| 6,950,534 B2 | 9/2005 | Cohen et al. | |
| 7,003,134 B1 | 2/2006 | Covell et al. | |
| 7,036,094 B1 | 4/2006 | Cohen et al. | |
| 7,038,855 B2 | 5/2006 | French et al. | |
| 7,039,676 B1 | 5/2006 | Day et al. | |
| 7,042,440 B2 | 5/2006 | Pryor et al. | |
| 7,050,606 B2 | 5/2006 | Paul et al. | |
| 7,058,204 B2 | 6/2006 | Hildreth et al. | |
| 7,060,957 B2 | 6/2006 | Lange et al. | |
| 7,103,238 B2 | 9/2006 | Shyu et al. | |
| 7,113,918 B1 | 9/2006 | Ahmad et al. | |
| 7,121,946 B2 | 10/2006 | Paul et al. | |
| 7,170,492 B2 | 1/2007 | Bell | |
| 7,184,048 B2 | 2/2007 | Hunter | |
| 7,202,898 B1 | 4/2007 | Braun et al. | |
| 7,222,078 B2 | 5/2007 | Abelow | |
| 7,227,526 B2 | 6/2007 | Hildreth et al. | |
| 7,233,025 B2 | 6/2007 | Davuluri et al. | |
| 7,259,747 B2 | 8/2007 | Bell | |
| 7,282,734 B2 | 10/2007 | Yamazaki et al. | |
| 7,306,377 B2 | 12/2007 | Ellison | |
| 7,308,112 B2 | 12/2007 | Fujimura et al. | |
| 7,317,836 B2 | 1/2008 | Fujimura et al. | |
| 7,348,963 B2 | 3/2008 | Bell | |
| 7,359,121 B2 | 4/2008 | French et al. | |
| 7,367,887 B2 | 5/2008 | Watabe et al. | |
| 7,379,563 B2 | 5/2008 | Shamaie | |
| 7,379,566 B2 | 5/2008 | Hildreth | |
| 7,388,283 B2 | 6/2008 | Grewal | |
| 7,389,591 B2 | 6/2008 | Jaiswal et al. | |
| 7,412,077 B2 | 8/2008 | Li et al. | |
| 7,421,093 B2 | 9/2008 | Hildreth et al. | |
| 7,430,312 B2 | 9/2008 | Gu | |
| 7,436,496 B2 | 10/2008 | Kawahito | |
| 7,450,736 B2 | 11/2008 | Yang et al. | |
| 7,452,275 B2 | 11/2008 | Kuraishi | |
| 7,460,690 B2 | 12/2008 | Cohen et al. | |
| 7,489,812 B2 | 2/2009 | Fox et al. | |
| 7,536,032 B2 | 5/2009 | Bell | |

(56) References Cited

U.S. PATENT DOCUMENTS

| | | | |
|---|---|---|---|
| 7,555,142 B2 | 6/2009 | Hildreth et al. | |
| 7,560,701 B2 | 7/2009 | Oggier et al. | |
| 7,570,805 B2 | 8/2009 | Gu | |
| 7,574,020 B2 | 8/2009 | Shamaie | |
| 7,576,727 B2 | 8/2009 | Bell | |
| 7,590,262 B2 | 9/2009 | Fujimura et al. | |
| 7,593,552 B2 | 9/2009 | Higaki et al. | |
| 7,598,942 B2 | 10/2009 | Underkoffler et al. | |
| 7,607,509 B2 | 10/2009 | Schmiz et al. | |
| 7,620,202 B2 | 11/2009 | Fujimura et al. | |
| 7,668,340 B2 | 2/2010 | Cohen et al. | |
| 7,680,298 B2 | 3/2010 | Roberts et al. | |
| 7,683,954 B2 | 3/2010 | Ichikawa et al. | |
| 7,684,592 B2 | 3/2010 | Paul et al. | |
| 7,701,439 B2 | 4/2010 | Hillis et al. | |
| 7,702,130 B2 | 4/2010 | Im et al. | |
| 7,704,135 B2 | 4/2010 | Harrison, Jr. | |
| 7,710,391 B2 | 5/2010 | Bell et al. | |
| 7,728,345 B2 | 6/2010 | Cao | |
| 7,729,530 B2 | 6/2010 | Antonov et al. | |
| 7,746,345 B2 | 6/2010 | Hunter | |
| 7,760,182 B2 | 7/2010 | Ahmad et al. | |
| 7,809,167 B2 | 10/2010 | Bell | |
| 7,834,846 B1 | 11/2010 | Bell | |
| 7,852,262 B2 | 12/2010 | Namineni et al. | |
| 7,876,795 B2 | 1/2011 | Belenky et al. | |
| 7,878,689 B2 | 2/2011 | Sun et al. | |
| RE42,256 E | 3/2011 | Edwards | |
| 7,898,522 B2 | 3/2011 | Hildreth et al. | |
| 8,035,612 B2 | 10/2011 | Bell et al. | |
| 8,035,614 B2 | 10/2011 | Bell et al. | |
| 8,035,624 B2 | 10/2011 | Bell et al. | |
| 8,072,470 B2 | 12/2011 | Marks | |
| 8,105,854 B2 | 1/2012 | Lee et al. | |
| 2003/0032337 A1 | 2/2003 | Sorensen | |
| 2003/0052380 A1 | 3/2003 | Yeo et al. | |
| 2005/0017488 A1* | 1/2005 | Breed et al. | 280/735 |
| 2005/0280018 A1 | 12/2005 | Imai | |
| 2006/0214173 A1 | 9/2006 | Beeson et al. | |
| 2007/0029569 A1 | 2/2007 | Andrews | |
| 2008/0026838 A1 | 1/2008 | Dunstan et al. | |
| 2008/0099770 A1* | 5/2008 | Mendendorp et al. | 257/79 |
| 2009/0284161 A1* | 11/2009 | Kumar et al. | 315/209 R |
| 2010/0207142 A1 | 8/2010 | Chen et al. | |
| 2010/0207159 A1 | 8/2010 | Jeong | |
| 2011/0303941 A1* | 12/2011 | Lee | 257/98 |
| 2012/0037937 A1* | 2/2012 | Wang et al. | 257/98 |
| 2012/0140484 A1 | 6/2012 | Sander et al. | |
| 2012/0287646 A1 | 11/2012 | Mandelboum et al. | |

FOREIGN PATENT DOCUMENTS

| | | |
|---|---|---|
| EP | 0583061 A2 | 2/1994 |
| JP | H07 288341 | 10/1995 |
| JP | 08044490 A1 | 2/1996 |
| JP | 2008 258296 | 10/2008 |
| WO | 93/10708 A1 | 6/1993 |
| WO | 97/17598 A1 | 5/1997 |
| WO | 99/44698 A1 | 9/1999 |
| WO | 2012112310 | 8/2012 |
| WO | 2012154510 | 11/2012 |

OTHER PUBLICATIONS

Nanostack Pulsed Laser Diode in Plastic Package, 10W Peak Power; Lead (Pb) Free Product-RoHS Compliant; from Osram website/catalog:SPL PL85; Mar. 4, 2009, Data Sheet: http://catalog.osram-os.com/catalogue/catalogue.do?favOid=0000000200020fc100070023&act=showBookmark.

Kanade et al., "A Stereo Machine for Video-rate Dense Depth Mapping and Its New Applications", IEEE Computer Society Conference on Computer Vision and Pattern Recognition, 1996, pp. 196-202,The Robotics Institute, Carnegie Mellon University, Pittsburgh, PA.

Miyagawa et al., "CCD-Based Range Finding Sensor", Oct. 1997, pp. 1648-1652, vol. 44 No. 10, IEEE Transactions on Electron Devices.

Rosenhahn et al., "Automatic Human Model Generation", 2005, pp. 41-48, University of Auckland (CITR), New Zealand.

Aggarwal et al., "Human Motion Analysis: A Review", IEEE Non-rigid and Articulated Motion Workshop, 1997, University of Texas at Austin, Austin, TX.

Shao et al., "An Open System Architecture for a Multimedia and Multimodal User Interface", Aug. 24, 1998, Japanese Society for Rehabilitation of Persons with Disabilities (JSRPD), Japan.

Kohler, "Special Topics of Gesture Recognition Applied in Intelligent Home Environments", In Proceedings of the Gesture Workshop, 1998, pp. 285-296, Germany.

Kohler, "Vision Based Remote Control in Intelligent Home Environments", University of Erlangen-Nuremberg/Germany, 1996, pp. 147-154, Germany.

Kohler, "Technical Details and Ergonomical Aspects of Gesture Recognition applied in Intelligent Home Environments", 1997, Germany.

Hasegawa et al., "Human-Scale Haptic Interaction with a Reactive Virtual Human in a Real-Time Physics Simulator", Jul. 2006, vol. 4, No. 3, Article 6C, ACM Computers in Entertainment, New York, NY.

Qian et al., "A Gesture-Driven Multimodal Interactive Dance System", Jun. 2004, pp. 1579-1582, IEEE International Conference on Multimedia and Expo (ICME), Taipei, Taiwan.

Zhao, "Dressed Human Modeling, Detection, and Parts Localization", 2001, The Robotics Institute, Carnegie Mellon University, Pittsburgh, PA.

He, "Generation of Human Body Models", Apr. 2005, University of Auckland, New Zealand.

Isard et al., "Condensation—Conditional Density Propagation for Visual Tracking", 1998, pp. 5-28, International Journal of Computer Vision 29(1), Netherlands.

Livingston, "Vision-based Tracking with Dynamic Structured Light for Video See-through Augmented Reality", 1998, University of North Carolina at Chapel Hill, North Carolina, USA.

Wren et al., "Pfinder: Real-Time Tracking of the Human Body", MIT Media Laboratory Perceptual Computing Section Technical Report No. 353, Jul. 1997, vol. 19, No. 7, pp. 780-785, IEEE Transactions on Pattern Analysis and Machine Intelligence, Caimbridge, MA.

Breen et al., "Interactive Occlusion and Collusion of Real and Virtual Objects in Augmented Reality", Technical Report ECRC-95-02, 1995, European Computer-Industry Research Center GmbH, Munich, Germany.

Freeman et al., "Television Control by Hand Gestures", Dec. 1994, Mitsubishi Electric Research Laboratories, TR94-24, Caimbridge, MA.

Hongo et al., "Focus of Attention for Face and Hand Gesture Recognition Using Multiple Cameras", Mar. 2000, pp. 156-161, 4th IEEE International Conference on Automatic Face and Gesture Recognition, Grenoble, France.

Pavlovic et al., "Visual Interpretation of Hand Gestures for Human-Computer Interaction: A Review", Jul. 1997, pp. 677-695, vol. 19, No. 7, IEEE Transactions on Pattern Analysis and Machine Intelligence.

Azarbayejani et al., "Visually Controlled Graphics", Jun. 1993, vol. 15, No. 6, IEEE Transactions on Pattern Analysis and Machine Intelligence.

Granieri et al., "Simulating Humans in VR", The British Computer Society, Oct. 1994, Academic Press.

Brogan et al., "Dynamically Simulated Characters in Virtual Environments", Sep./Oct. 1998, pp. 2-13, vol. 18, Issue 5, IEEE Computer Graphics and Applications.

Fisher et al., "Virtual Environment Display System", ACM Workshop on Interactive 3D Graphics, Oct. 1986, Chapel Hill, NC.

"Virtual High Anxiety", Tech Update, Aug. 1995, pp. 22.

Sheridan et al., "Virtual Reality Check", Technology Review, Oct. 1993, pp. 22-28, vol. 96, No. 7.

Stevens, "Flights into Virtual Reality Treating Real-World Disorders", The Washington Post, Mar. 27, 1995, Science Psychology, 2 pages.

"Simulation and Training", 1994, Division Incorporated.

(56) References Cited

OTHER PUBLICATIONS

Chip-On-Board LED; retrieved:Oct. 15, 2012; www.prophotonix.com/resources/Technical-Overviews/about-chip-on-board.aspx; http://www.prophotonix.com/resources/Technical-Overviews/about-chip-on-board.aspx.

Crisp Richard; Invensas Corp; Multi-die DRAM packaging technology drives down Ultrabook platform cost—Part 1; www.eetimes.com; May 25, 2012, 1:44 PM EDT; http://www.eetimes.com/design/memory-design/4373857/-Multi-die-DRAM-packaging-technology-drives-down-Ultrabook-platform-cost---part-1.

PCT International Search Report: PCT/US2012/036385 mailed on Oct. 23, 2012.

"Design Strategies for Stray Inductance Optimized Wire-Bond Power Modules"; Muhlfeld, Ole et al.; Institute of Power Electronics and Electrical Drives, Christian-Albrechts University of Kiel, Germany; Conference PCIM Europe 2010, pp. 244-248.

Pulsed Laser Diodes; from Osram website, Osram catalog, Product Family Overview, Oct. 30, 2007: http://catalog.osram-os.com/catalogue/catalogue.do?act=showBookmark&favOid=0000000200019007001c0023.

International Search Report dated Mar. 13, 2014 for corresponding PCT Application No. PCT/US2013/073952, International filing date Dec. 9, 2013.

\* cited by examiner

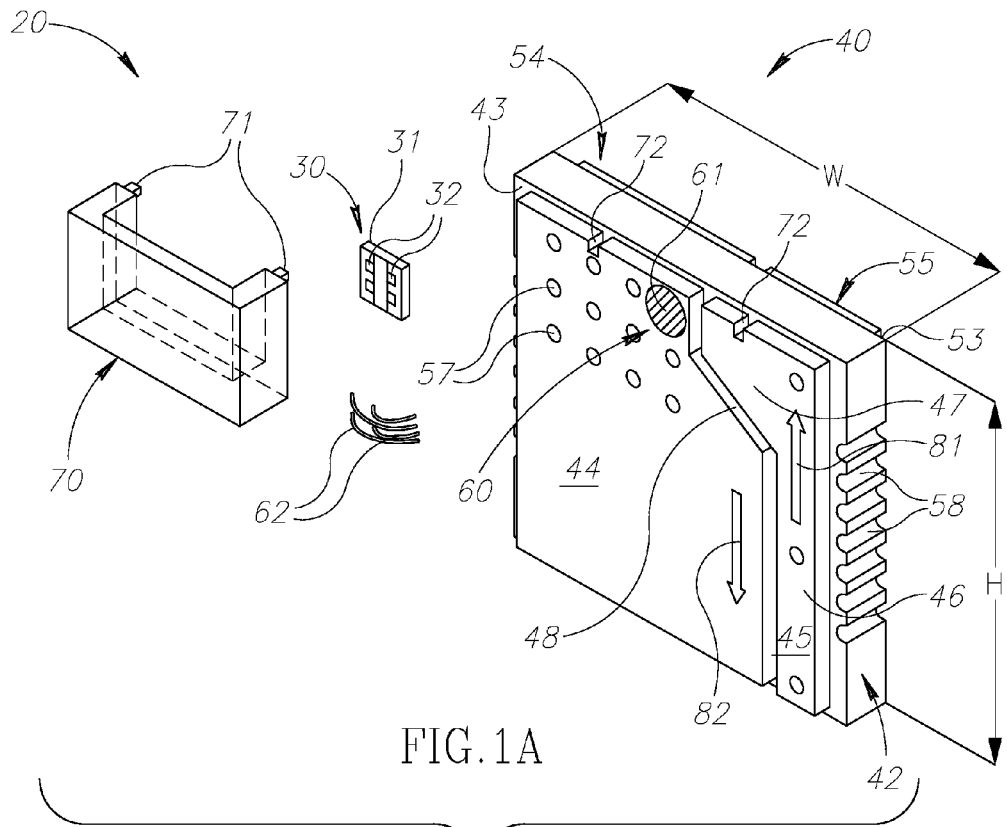
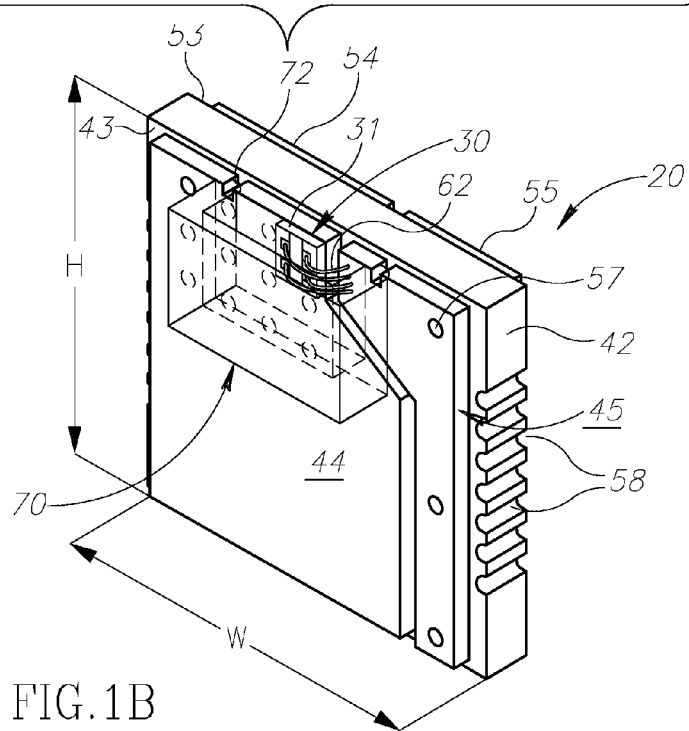
FIG.1A
FIG.1B

LASER DIE LIGHT SOURCE MODULE WITH LOW INDUCTANCE

TECHNICAL FIELD

Embodiments of the invention relate to illumination systems that provide short pulses of light.

BACKGROUND

Illumination systems configured to produce a train of light pulses that are repeated at high frequency are used as stroboscopic, fast photography lamps for studying ultrafast processes in physics, chemistry, and biology. Such illumination systems are also used to provide pulses of light in time of flight (TOF) cameras often referred to as TOF three dimensional (3D) cameras that provide distance measurements to features in a scene that they image.

"TOF-3D" cameras determine distances to features in a scene by acquiring an image, conventionally referred to as a "range image", of the scene that can be processed to determine how long it takes light to travel from the camera to the features and back to the camera. The round trip flight times of the light to and back from the features determined from the range image and the speed of light are used to determine the distances to the features.

In some TOF-3D cameras, to acquire a range image suitable for processing to determine the times of flight, a light source transmits a train of short duration pulses of light to illuminate the scene. Following a predetermined delay after transmittal of each light pulse in the light pulse train, the camera is shuttered open for a short exposure period. Light from the light pulse that is reflected by features in the scene, and that reaches the camera during the exposure period, is imaged by the camera on pixels of the camera's photosensor. An amount of light from all the light pulses in the train that is registered by a given pixel is used to determine a round trip time of flight for light to travel to and back from a feature imaged on the given pixel, and therefrom a distance to the feature.

Light pulses in a light pulse train transmitted by a light source to illuminate a scene imaged by a TOF-3D camera and exposure periods of the TOF-3D camera may have durations as short as a few nanoseconds and repetition frequencies greater than a megahertz (MHz). Furthermore, amounts of light that features in the scene reflect from the transmitted light pulses are generally limited. As a result, an amount of reflected light from a feature that reaches the TOF-3D camera and is imaged on a pixel of the camera may not be sufficient to determine a distance to the feature having an acceptable signal to noise ratio (SNR).

Compensating for factors that limit amounts of light available for acquiring an acceptable range image by increasing light intensity provided by the light source is generally both technically and cost-wise challenging. Cost considerations and heat dissipation requirements for maintaining the light source, and camera, at an acceptable operating temperature usually limit intensity of illumination provided by the light source. The fast switching demands mandated by the light pulse and exposure period high repetition rates, which as noted above may exceed a megahertz (MHz), and a common demand that electronic and optical components of systems have small footprints compound the challenges. A footprint of an electronic component conventionally refers to a size of an area of a circuit board that the component occupies. If a volume that a circuit occupies is a relevant characteristic for consideration, a volume occupied by a component may be understood to be the component's footprint.

SUMMARY

An aspect of embodiments of the invention relates to providing a light source module comprising a semiconductor light source and a low inductance electrical connector that mechanically supports the light source and provides conductors for electrically connecting it to a power supply. In an embodiment, the electrical connector comprises a relatively small printed circuit board (PCB) mount having formed thereon low inductance electrically conducting traces that carry current from the power supply to and from the semiconductor light source. The traces also function as thermally conducting channels for dissipation of heat generated by operation of the semiconductor light source.

In an embodiment of the invention, to configure the traces so that they are characterized by relatively low inductance, the traces are formed so that they are relatively short along directions in which current in the traces flow, and relatively wide in directions perpendicular to directions of current flow. Optionally, to reduce inductance of the traces, traces that carry current to the light source are parallel and relatively close to traces that carry current away from the light source. The relatively low inductance traces contribute to efficient use by the light source of energy available from the power supply. The low inductance traces also operate to moderate transient voltage swings that may accompany switching on and switching off the light source at high frequencies when it is operated to produce short light pulses at a high repetition rate. To provide enhanced thermal conductivity of the traces, the traces may be made relatively thick.

In an embodiment of the invention, the semiconductor light source is electrically and mechanically connected to the PCB mount by bonding an electrical contact of the semiconductor light source to a first conducting trace of the PCB mount with a conducting bonding material.

Optionally, the electrical contact functions to connect the semiconductor light source to a power supply that powers the light source. A second electrical contact of the semiconductor light source that functions to connect the light source to the power supply is optionally electrically connected to a second trace of the conducting traces by at least one bondwire. The semiconductor light source may be a diode laser and the first electrical contact a cathode of the laser diode or a contact connected to the cathode, and the second electrical contact an anode of the laser diode or a contact connected to the anode. In an embodiment of the invention, the conducting traces are configured to readily be connected to a motherboard so that the traces of the PCB mount contact conducting tracks in the motherboard connected to circuitry for powering and/or controlling the semiconductor light source.

The relative small size and simple construction of a semiconductor light source module in accordance with an embodiment of the invention, enables a large number of the modules to simultaneously and rapidly be produced in a relatively simple and inexpensive manufacturing process.

In an embodiment of the invention the semiconductor light source module is coupled to a lens tube comprising optics that configure and direct light provided by the semiconductor light source module's source to provide a beam of light for illuminating a desired field of view.

In the discussion, unless otherwise stated, adjectives such as "substantially" and "about" modifying a condition or relationship characteristic of a feature or features of an embodiment of the invention, are understood to mean that the condition or characteristic is defined to within tolerances that are acceptable for operation of the embodiment for an application for which it is intended.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF FIGURES

Non-limiting examples of embodiments of the invention are described below with reference to figures attached hereto that are listed following this paragraph. Identical features that appear in more than one figure are generally labeled with a same label in all the figures in which they appear. A label labeling an icon representing a given feature of an embodiment of the invention in a figure may be used to reference the given feature. Dimensions of features shown in the figures are chosen for convenience and clarity of presentation and are not necessarily shown to scale.

FIGS. 1A and 1B schematically show an exploded view and an assembled view respectively of a low inductance light source module, in accordance with embodiments of the invention;

DETAILED DESCRIPTION

Figure 3A:
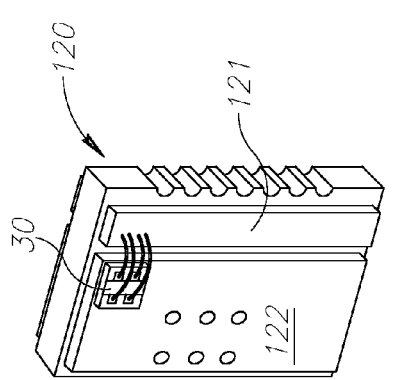
FIGS. 3A and 3B schematically show additional light source modules in accordance with embodiments of the invention.

FIGS. 1A and 1B schematically show an exploded view and an assembled view respectively of a light source module 20 comprising a semiconductor light source 30 mounted to a low inductance PCB mount 40, in accordance with an embodiment of the invention.

By way of example, in FIG. 1A and figures that follow light source 30 is assumed to be an edge emitter laser diode from which light generated by the laser diode exits via an edge 31 of the diode. Laser diode 30 has anode contacts 32 for electrically connecting an anode (not shown) in the laser diode to a power supply that powers the laser diode. A cathode (not shown) comprised in the laser diode, or an electrical contact to the cathode, for electrically connecting the power supply to the laser diode is exposed on a side of the laser diode opposite to the side on which contacts 32 are located. Laser diode 30 may be operable for use in a TOF-3D camera to provide short light pulses at a high repetition rate.

PCB mount 40 optionally comprises an insulating substrate 42 on a first side 43 of which are formed first and second conducting traces 44 and 45 respectively. Optionally, mirror image conducting traces 54 and 55 are formed on a second side 53 of the insulating substrate. In the perspective of FIGS. 1A and 1B only edges of minor image conducting traces 54 and 55 are shown. Optionally, conducting traces 44 and 45 are electrically connected to mirror image conducting traces 54 and 55 respectively by conducting vias 57. Optionally, PCB mount 40 is separated from a larger PCB board along separation lines, for example by sawing or snapping, in the larger PCB board and has scalloped edges 58 resulting from holes formed in the larger PCB board to facilitate separating the PCB mount from the larger PCB board. For convenience of presentation first and second conducting traces 44 and 45 are referred to as a cathode trace 44 and an anode trace 45 and minor image traces 54 and 55 are referred to as minor image anode and cathode traces 54 and 55. Conducting traces 44, 45, 54, and 55 may be formed from any suitable conducting material such as copper, or silver, or copper plated with nickel, palladium or gold.

A region 60 of cathode trace 44 is reserved for bonding to laser diode 30. Optionally, laser diode 30 is mechanically and electrically bonded to cathode trace 44 by bonding the cathode of laser diode 30 to region 60 using an electrically conducting bonding agent, such as a suitable conducting polymer or an electrically conducting epoxy. Region 60 is schematically shown in FIG. 1A having a quantity of electrically conducting bonding material, represented by a circle 61, for bonding the cathode of laser diode 30 and thereby the laser diode to cathode trace 44. Laser diode 30 is electrically connected to anode trace 45 by electrically connecting each anode contact 32 to leaf 47 of the anode trace by a bondwire 62.

Cathode trace 44 may be formed having a recess into which at least a portion of anode trace 44 extends so that bondwires 62 that connect contacts 32 with the anode trace may be made relatively short to reduce their inductance. By way of example, in an embodiment of the invention, as schematically shown in FIGS. 1A and 1B cathode 44 is formed having a recess 48 for receiving a portion of anode trace 45. Optionally anode trace 45 is L shaped, comprising a stem 46 and a portion that extends into recess 48 in a shape of a protrusion 47, hereinafter referred to as a "leaf" 47, extending from the stem and into recess 48.

A protective cover 70 may be mounted to PCB mount 40 to protect laser diode 30 and bondwires 62. Optionally, cover 70 is formed having mounting nubs 71 that match nub recesses 72 formed in cathode and anode traces 44 and 45. When mounting protective cover 70 to PCB mount 40, mounting nubs 71 are inserted into nub recesses 72 to assure proper alignment of the protective cover with the PCB mount.

During operation of laser diode 30 to generate light, current provided by a power supply that powers the laser diode flows into laser diode 30 along anode and mirror anode traces 44 and 45 to enter the diode via bondwires 62 and anode contacts 32. The current that enters laser diode 30 flows out of the laser diode via the laser diode cathode along cathode and mirror cathode traces 44 and 54. Anode and cathode traces 45 and 44 and their minor traces 55 and 54 are configured so that currents flowing into and out of laser diode 30 flow in substantially opposite directions and relatively close to each other to reduce inductance that the traces present to the power supply powering laser diode 30. The traces are also formed relatively wide in directions perpendicular to current flow and relatively short in directions parallel to flow of current to reduce inductance. Current flow into the laser diode along anode and minor anode traces 45 and 55 is schematically represented by a block arrow 81. Current flow out of the laser diode along cathode and mirror cathode traces 44 and 54 is schematically indicated by a block arrow 82.

In accordance with an embodiment of the invention cathode trace 44 to which laser diode is directly mounted is relatively large and optionally relatively thick so that it serves as a heat sink and thermal conductor for dissipating heat generated by laser diode 30 during operation of the laser diode. The configuration of cathode trace 44 having a recess 48 for receiving leaf 47 of anode 45 operates to extend the cathode trace laterally relative to the location of laser diode 30 on the cathode. The lateral extension tends to increase an amount of the cathode material at given distance from the laser diode and a cross section for heat transfer of the cathode trace.

By way of a numerical example, in an embodiment of the invention, laser diode 30 may be rectangular and have sides whose lengths are less than or equal to about 1 mm. PCB mount 40 may have a height, "H", less than or equal to about 5 mm and a width, "W", less than or equal to about 5 mm. Stems 46 of anode and minor anode trace 45 may have widths less than or equal to about 0.6 mm and cathode trace 44 may have width less than or equal to about 3.7 mm. Optionally, insulating layer 42 has thickness equal to or less than about 0.5 mm and conducting traces 44, 45, 54 and 55 may have thicknesses between about 0.1 and about 0.2 mm.

In an embodiment of the invention, bondwires 62 that connect anode contacts 32 to leaf 47 have lengths less than or equal to about 0.75 mm. Optionally, the bondwire lengths are less than or equal to about 0.5 mm. In some embodiments of the invention, bondwires 32 have lengths less than or equal to about 0.4 mm.

In an embodiment of the invention, a configuration of anode and cathode traces and their minor image traces provide PCB mount 40 with an inductance less than or equal to about 3 nH (nanoHenrys). In some embodiments of the invention, PCB mount 40 is characterized by an inductance less than or equal to about 1.5 nH. For cathode and anode traces 44 and 45 having widths equal respectively to about 3.7 mm and 0.6 mm respectively and lengths equal to about 5 mm, PCB mount 40 presents an inductance less than or equal to about 1.5 nH to a circuit that controls laser diode 30. The inductance that characterizes PCB mount 40 for the above noted dimensions is less than conventional configurations of conductors, which are typically characterized by inductances equal to or greater than about 4 nH.

It is noted that an "effective" length of a trace 44, 45, 54, and 55, for calculating inductance of PCB mount 40 is assumed to be about 3 mm less than the actual physical length of the trace. The effective length of a trace, is a length along the trace that current travels to or from laser diode 30 from a point along the trace at which a circuit that drives laser diode 30 makes electrical contact with the trace. It is assumed that the distance from the point of electrical contact, which may for example, be a solder joint along the trace, is less than the actual length of the trace by about 3 mm.

Because of its relatively small size and simple construction, a light source module in accordance with an embodiment of the invention, similar to light source module 20 is relatively easily and inexpensively produced, and a relatively large plurality of the light sources may be simultaneously produced.

Figure 2:
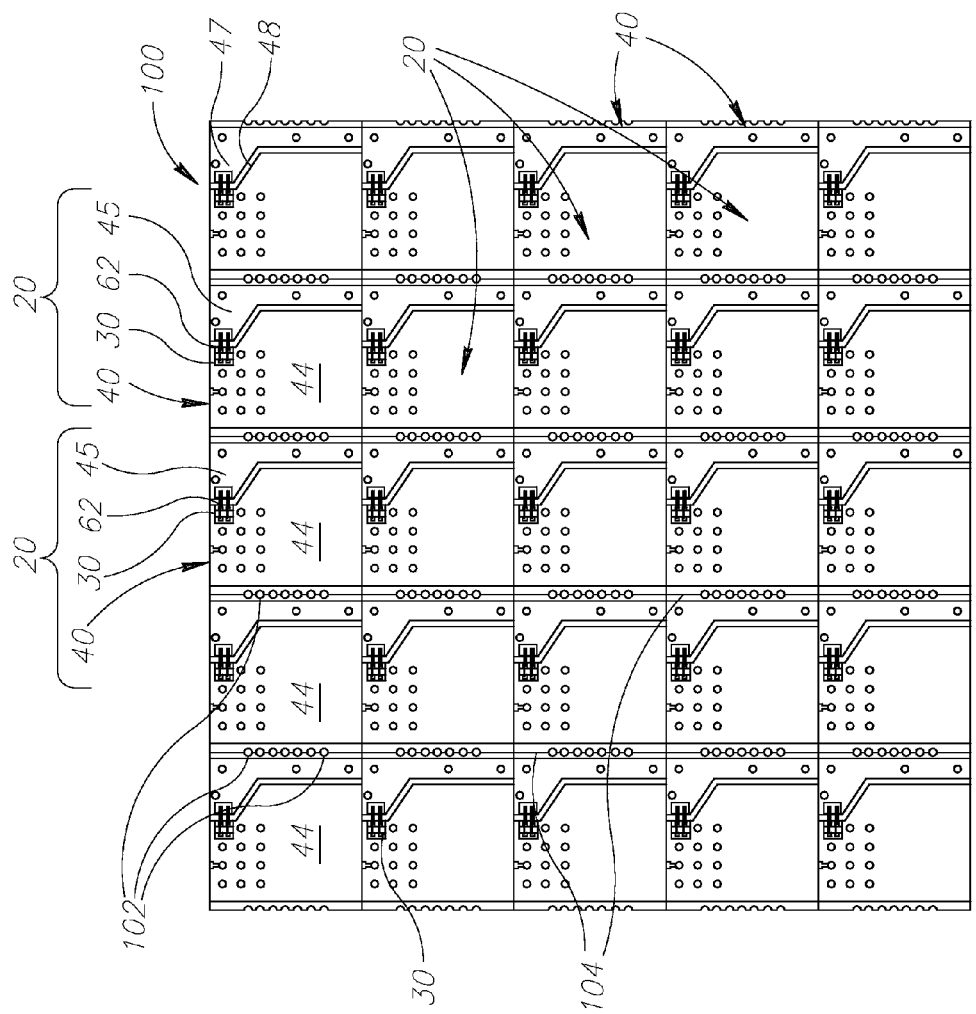
FIG. 2 schematically shows a PCB board at a stage of a production process for simultaneously producing a plurality of light source modules similar to the light source module shown in FIGS. 1A and 1B, in accordance with an embodiment of the invention.

By way of example, FIG. 2 schematically shows a PCB board 100 at a stage of a production process for simultaneously producing a plurality of light source modules in accordance with an embodiment of the invention similar to light source module 20. At the production stage shown in the figure, PCB board 100 has formed thereon a plurality of PCB mounts 20 and a laser diode 30 is bonded to cathode trace 44 of each PCB mount 40 and is electrically connected to the anode trace 45 of the PCB mount by bondwires 62. A surface mount technology (SMT) pick and place machine may have been used to bond laser diode 30 to the cathode trace. Bondwires 62 may have been connected between anode trace 45 and anode conducting pads 32 of laser diode 30 on each PCB mount using any of various suitable automatic wire bonding processes and machines. Through holes 102 formed in PCB board 100 along separation lines 104 facilitate separating columns of PCB mounts 40 by any of various separation processes, such as sawing, laser cutting, and/or snapping. At the stage of the production process shown in FIG. 2 protective covers 70 (FIGS. 1A and 1B) have not as yet been attached to PCB mounts 20. The protective covers may be mounted PCB mounts 40 prior to separation of the PCB mounts from PCB board 100 or after separation.

Figure 3B:
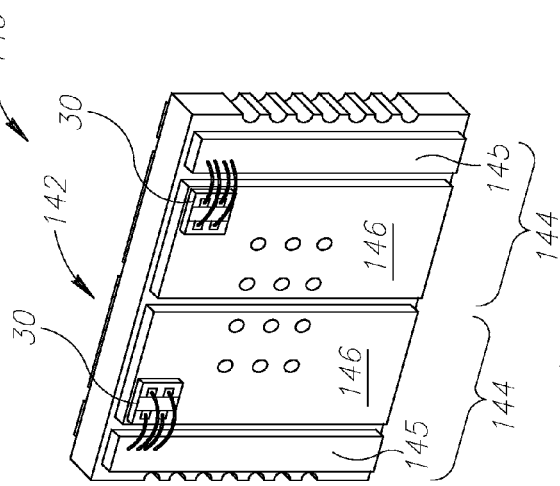

FIGS. 3A and 3B schematically show light source modules 120 and 140 that are variations of light source module 20 shown in FIGS. 1A-1B, in accordance with embodiments of the invention. Light source module 120 shown in FIG. 3A has rectangular anode and cathode traces 121 and 122 rather than anode and cathode traces 45 and 44 having a leaf 47 and matching recess 48 respectively. Light source module 140 shown in FIG. 3B comprises a dual PCB mount 142 having two laser diodes 30 mounted to matching sets 144 of anode and cathode traces 145 and 146 formed on the PCB mount.

It is noted that whereas light source modules 20, 120, and 140 show a laser diode 30 located on only one side of a PCB mount, embodiments of the invention are not limited to light source modules having a light source on only one side of a PCB mount. For example, a light source module in accordance with an embodiment of the invention having a configuration of cathode and anode traces 44 and 45 and mirror traces 54 and 55 similar to that of light source module 20 (FIG. 1B), may also have in addition to laser diode 30 a laser diode mounted to the minor cathode 54 and connected by bondwires to minor anode 55

It is further noted that whereas FIG. 1A and 1B schematically show light source module 20 having conducting traces 44 and 45 on a first side, 43, of PCB mount 40 and minor image conducting traces 54 and 55 on a second side, 53, of the PCB mount, a light source module in accordance with an embodiment of the invention is not limited to having traces or minor image traces on a second side of a PCB mount. A second side of a PCB mount comprised in a light source module in an embodiment may have for example a single large heat sink thermally coupled by a heat conducting via to an electrically conducting trace, such as conducting trace 44, on a first side of the PCB mount. Or, by way of another example, a light source module may have formed on a second side of a PCB mount circuitry that controls a semiconductor light source mounted to traces on a first side of the PCB mount.

Figure 4A:
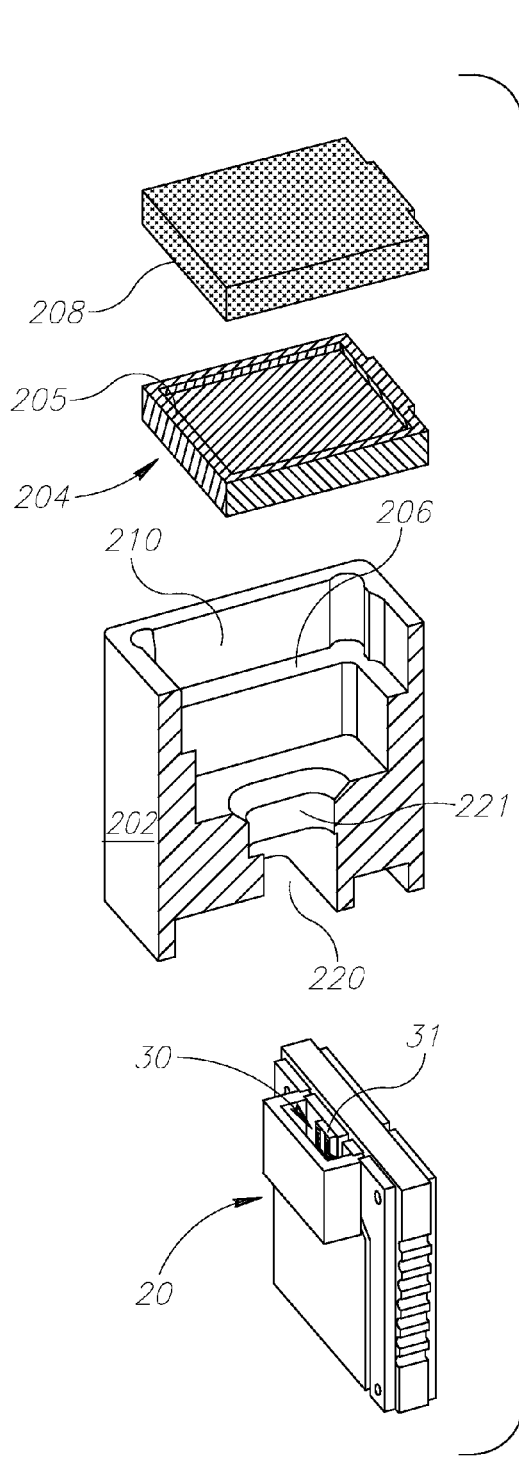
FIGS. 4A and 4B schematically show exploded and assembled, partially cutaway views of an illumination system comprising the light source module shown in FIGS. 1A-2 coupled to a lens tube, in accordance with an embodiment of the invention.
Figure 4B:
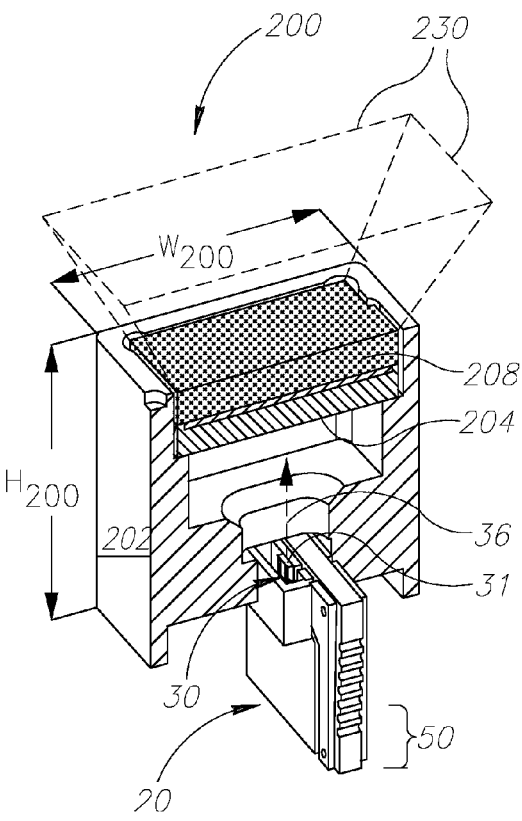

In an embodiment of the invention, at least one light source module, such as light source module 20, 120, or 140 is coupled to optics that receives and shapes light from laser diode 30 to provide an illumination system configured to provide a desire illumination pattern. By way of example, FIGS. 4A and 4B schematically show partially cutaway, exploded and assembled perspective views respectively of an illumination system 200 comprising light source module 20, in accordance with an embodiment of the invention.

Illumination system 200 comprises a lens tube 202 having an optionally rectangular Fresnel collimating lens 204 seated on a ledge 206 of a recess 210 formed in the tube. Collimating lens 204 may have a raised support edge 205 on which a rectangular diffuser 208 rests. Lens tube 202 may, by way of example, be fabricated from a metal, such as aluminum, or high impact plastic, such as a polystyrene or polystyrene copolymer, and is formed optionally having a substantially rectangular cross section. Lens 204 may be maintained in place on ledge 206 using any of various methods and devices known in the art. For example, the lens may be press fit into recess 210 and/or bonded by a suitable adhesive or epoxy to ledge 206. Diffuser 208 may be bonded to raised edge 205 and or press fit into recess 210.

Light source module 20 seats in a recess 220 formed in lens tube 202 having a shape and depth that is matched to receive and secure the light source module with a sufficient portion 50 of the light source module protruding from lens 202 tube to enable the light source module to conveniently be plugged into a socket that provides the light source module with power. When secured in recess 220, the recess holds light source module 20 aligned with a lumen 221 formed in the lens tube so that light, represented by a dashed arrow 36 in FIG. 4B, generated by laser diode 30 that exits the laser diode via edge 31 may propagate through the lumen to Fresnel lens 204.

Fresnel lens 204, collimates light 36 that it receives from laser diode 30 and directs it to diffuser 208. Diffuser 208 optionally configures the light it receives from lens 204 into a beam of light having a desired shape. By way of example in FIG. 4B diffuser 208 configures light it receives from lens 204 into a pyramid shaped cone beam of light whose outer envelope is schematically represented by dashed lines 230, which numeral is also used to refer to the cone beam, to illuminate a desired field of view (FOV) (not shown). Optionally, cone beam 220 is configured to illuminate a FOV of a 3D-TOF camera.

In an embodiment an illumination system, such as illumination system 200, in accordance with an embodiment of the invention may be configured having a relatively small footprint. By way of a numerical example, in an embodiment of the invention, illumination system 200 has a height, $H_{200}$, less than or equal to about 7.5 mm. Optionally, $H_{200}$ is less than or equal to about 5 mm. A maximum width, $W_{200}$, of the illumination system is less than or equal to about 6 mm. In some embodiments of the invention, $W_{200}$ is equal to or less than 4 mm.

Figure 4C:
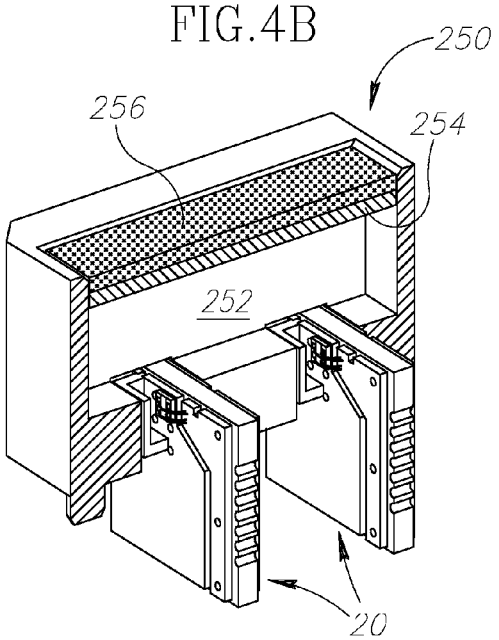
FIG. 4C schematically shows a cutaway view of an illumination system comprising two light source modules coupled to a same lens tube, in accordance with an embodiment of the invention.

An illumination system in accordance with an embodiment of the invention is not limited to comprising only one light source module, and may comprise a plurality of light source modules, optionally similar to light source module 20. FIG. 4C, by way of example, schematically shows an illumination system 250 in accordance with an embodiment of the invention comprising two light source modules 20 mounted in a lens tube 252, optionally having a rectangular cross section. Illumination system 250 may comprise a collimating lens 254 and diffuser 256 mounted to lens tube 252 similarly to the way in which Fresnel lens 204 and diffuser 208 are mounted in lens tube 202 shown in FIG. 4B.

Figure 5:
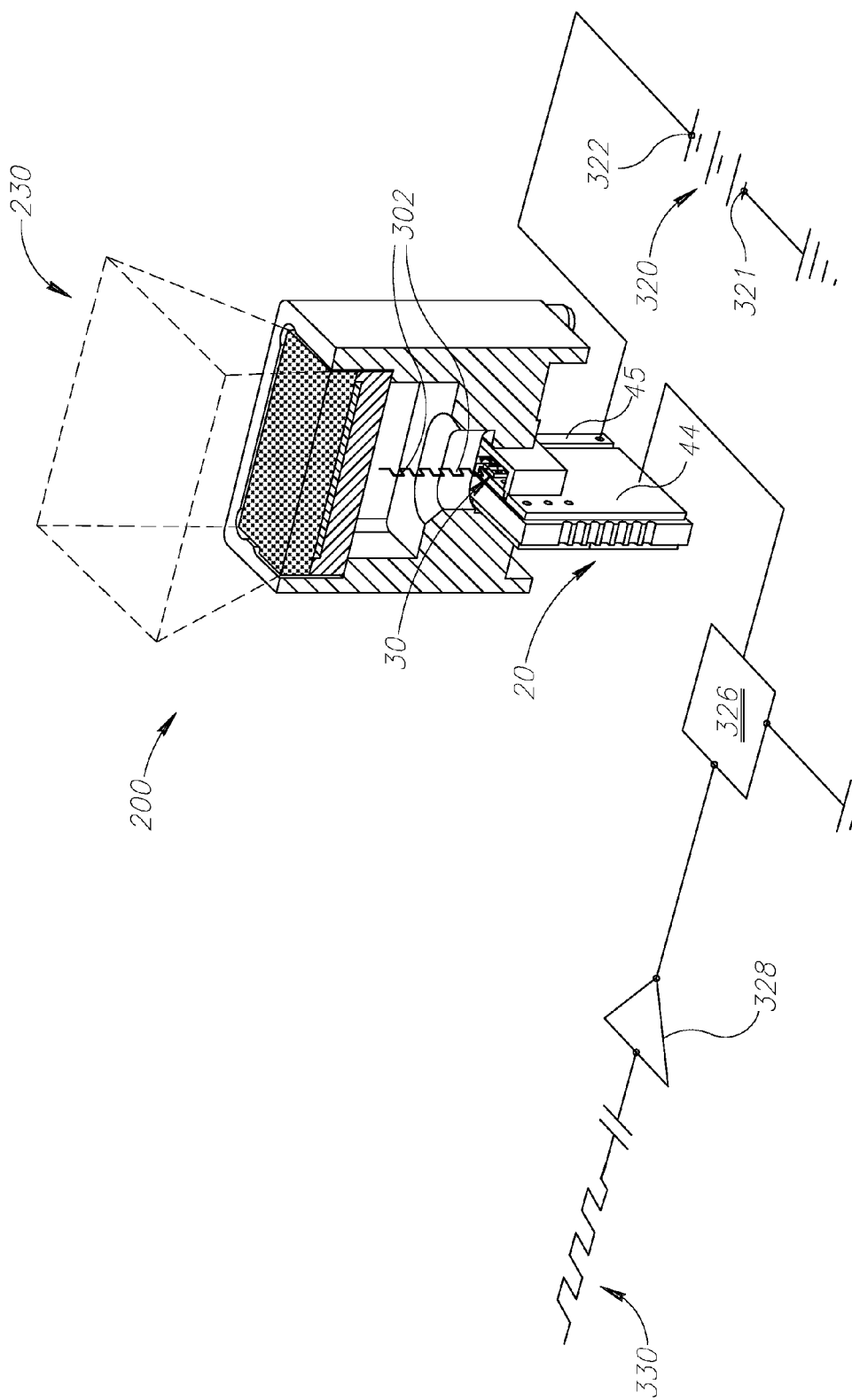
FIG. 5 shows a schematic of a circuit for driving a light source module similar to that shown in FIGS. 1A and 1B, in accordance with an embodiment of the invention.

FIG. 5 schematically shows illumination system 200 coupled to a circuit 300 that powers the illumination system and controls it to transmit a train of light pulses 302 characterized by pulses having pulse widths "$P_w$" and a repetition frequency "v", in accordance with an embodiment of the invention. The pulses propagate away from the illumination systems in cone beam 230 to illuminate a scene (not shown) toward which light system 200 is aimed.

Circuit 300 comprises a power supply 320 having a first, negative terminal 321 connected to ground and a second, positive terminal 322 connected to conducting anode trace 45. Cathode trace 44 is connected to a switch 326. A driver 328 selectively controls the switch to connect cathode trace 44 to ground or disconnect it from ground. When switch 326 connects cathode trace 44 to ground, current flows from power supply 320 through laser diode 30 and the laser diode emits light. Current ceases to flow through laser diode 30 and the laser diode stops emitting light when switch 326 disconnects conducting cathode trace 44 from ground. Switch 326 is a switch characterized by rise and fall times that are short relative to pulse width $P_w$, and has resistance and inductance that are relatively small in comparison to resistance and inductance contributed to circuit 300 by laser diode 30 and cathode and anode traces 45 and 45 and mirror cathode and anode traces 54 and 55.

Driver 328 optionally controls switch 326 responsive to an input signal schematically represented by a pulse train 330 repeatedly to turn on and turn off, and thereby to connect cathode trace 44 to ground for periods having duration $P_w$ at a repetition frequency v. As a result, illumination system 200 transmits light pulses 302 having pulse width substantially equal to $P_w$ at a repetition frequency v. In an embodiment of the invention, as by way of example given below, intensity I, light pulse width $P_w$, and transmission repetition frequency v are suitable to provide light pulses for acquiring a range image of the scene by a TOF 3D camera.

In an embodiment of the invention, $P_w$ is less than or equal to about 20 ns FWHM (full width half max). Optionally, $P_w$ is less than or equal to about 15 ns. In some embodiments of the invention, $P_w$ is about equal to 5 ns. Optionally, repetition frequency v is equal to or greater than 250 kHz. In some embodiments of the invention, v is greater than or equal to about 1 MHz. Optionally, the repetition frequency is greater than or equal to about 5 MHz.

By way of an example of an embodiment of the invention suitable for use in a TOF 3D camera, laser diode 30 is, optionally, a laser diode marketed by OSRAM Opto Semiconductors Inc. having catalogue number SPL-PL85-3 that provides light pulses at an IR wavelength equal to about 850 nm (nanometers). Switch 326 may be a metal-oxide- semiconductor field-effect transistor (MOSFET) such as a MOSFET marketed by Fairchild Semiconductor Corporation under the catalogue number FDMS8692. Switch FDMS8692 has a resistance less than or equal to about 10 mΩ (milliohms), and an inductance less than or equal to about 0.5 nH (nanohenry). The switch is characterized by a switching speed between on and off (conducting and non-conducting) states having rise and fall times respectively that are less than about 3 ns (nanoseconds).

Optionally, switch 326 is turned on and turned off by pulse train 330 to control the SPL-PL85-3 laser to produce light pulses 302 having pulse width $P_w$ equal to about 6 ns FWHM and repetition frequency v equal to about 0.8 MHz. Light pulses 302 may have a peak power of about 25 watts and provide optical power at about 90 mW (milliwatts). Assuming that illumination system 200 has an inductance equal to 2.3 nH referred to above, power supply 320 provides the illumination system with about 300 mW of electrical power. An efficiency with which the illumination system transduces electrical power into optical power is therefore about 30%. Further reduction in inductance resulting from configurations of conducting traces 44, 45, 54, and 55 in accordance with an embodiment of the invention may improve efficiency substantially linearly with the magnitude of the reduction.

A conventional illumination system having inductance equal to about 4 nH and producing the same light pulses at the same repetition frequency generally exhibits an efficiency for converting electrical to optical energy less than about 25%. A configuration of conductors in accordance with an embodiment of the invention, such as that exhibited by conductors 30 and 40 therefore provides an improvement in energy conversion between about 25% to about 30%.

In the description and claims of the present application, each of the verbs, "comprise" "include" and "have", and conjugates thereof, are used to indicate that the object or objects of the verb are not necessarily a complete listing of components, elements or parts of the subject or subjects of the verb.

Descriptions of embodiments of the invention in the present application are provided by way of example and are not intended to limit the scope of the invention. The described embodiments comprise different features, not all of which are required in all embodiments of the invention. Some embodiments utilize only some of the features or possible combinations of the features. Variations of embodiments of the invention that are described, and embodiments of the invention comprising different combinations of features noted in the described embodiments, will occur to persons of the art. The scope of the invention is limited only by the claims.

The invention claimed is:

1. A light source module comprising:
   a printed circuit board (PCB) mount having first and second sides and first and second conducting traces formed on the first side;
   a semiconducting light source having first and second electrical contacts for receiving power that excites the light source to emit light, wherein the first electrical contact is bonded to the first conducting trace with a conducting bonding material and the second electrical contact is connected by at least one bondwire to the second conducting trace;
   wherein the first and second traces extend to a same edge of the PCB so that the PCB may be inserted into a socket to connect the traces to a power supply that provides power to the semiconducting light source and are formed having at least one recess for aligning a preformed protective cover that protects the semiconducting light source to the module.

2. A light source module according to claim 1 wherein the first conducting trace is formed having a recess and the second conducting trace has a portion that extends into the recess.

3. A light source module according to claim 2 and comprising at least one heat conducting trace formed on the second side of the PCB mount.

4. A light source module according to claim 3 wherein the at least one heat conducting trace is thermally connected by at least one via to the first trace, the second trace, or both traces.

5. A light source module according to claim 4 wherein the at least one heat conducting trace comprises at least one electrically conducting trace.

6. A light source module according to claim 5 wherein the at least one electrically conducting trace comprises third and fourth electrically conducting traces.

7. A light source module according to claim 6 wherein the third and fourth conducting traces are minor images of the first and second conducting traces respectively.

8. A light source module according to claim 7 wherein the third and fourth conducting traces are connected respectively to the first and second conducting traces by vias.

9. A light source module according to claim 1 wherein current provided by a power supply that powers the semiconductor light source flows into and out from the semiconductor light source along the second and first conducting traces respectively and wherein the first and second conducting traces have lengths substantially parallel to current flow that is less than or equal to about 5 mm.

10. A light source module according to claim 9 wherein the first conducting trace has width in directions substantially perpendicular to current flow in the first conducting trace less than or equal to about 4 mm.

11. A light source module according to claim 9 wherein the second conducting trace has width in directions substantially perpendicular to current flow in the second conducting trace less than or equal to about 0.75 mm.

12. A light source module according to claim 9 wherein the first and second conducting traces have thickness greater than or equal to about 0.15 mm.

13. A light source module according to claim 1 wherein the at least one bondwire has a length less than or equal to about 0.5 mm.

14. A light source module according to claim 1 wherein the PCB mount is characterized by an inductance that is less than or equal to about 3 nH (nanoHenrys).

15. A light source module according to claim 1 wherein the PCB mount is characterized by an inductance that is less than or equal to about 1.5 nH.

16. A light source module according to claim 1 and comprising a protective cover that covers the semiconductor light source and the at least one bondwire.

17. A light source module according to claim 1 wherein the semiconductor light source comprises an edge emitting laser diode.

18. An illumination system comprising:
    at least one light source module according to claim 1;
    a tube having a recess in which the at least one light source module is seated;
    a lens seated in the tube that receives light from the at least one light source module and collimates the received light; and
    a diffuser seated in the tube that receives collimated light from the lens and diffuses the received light.

19. An illumination system according to claim 18 and comprising a circuit that controls the at least one light source to transmit a train of light pulses having pulse widths less than or equal to about 20 nanoseconds.

20. An illumination system according to claim 19 wherein the light pulses have a repetition frequency greater than or equal to about 0.8 MHz.

\* \* \* \* \*